(12) United States Patent
Lee et al.

(10) Patent No.: US 11,127,838 B2
(45) Date of Patent: Sep. 21, 2021

(54) METHOD OF FABRICATING METAL GATE TRANSISTOR

(71) Applicant: UNITED MICROELECTRONICS CORP., Hsin-Chu (TW)

(72) Inventors: Zhi-Cheng Lee, Tainan (TW); Wei-Jen Chen, Tainan (TW); Kai-Lin Lee, Kinmen County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 34 days.

(21) Appl. No.: 16/701,051

(22) Filed: Dec. 2, 2019

(65) Prior Publication Data

US 2021/0134981 A1    May 6, 2021

(30) Foreign Application Priority Data

Nov. 5, 2019    (TW) .................................. 108140046

(51) Int. Cl.
*H01L 29/66* (2006.01)

(52) U.S. Cl.
CPC .............................. *H01L 29/66545* (2013.01)

(58) Field of Classification Search
CPC .................................................. H01L 29/66545
See application file for complete search history.

(56) References Cited

U.S. PATENT DOCUMENTS

| 7,867,839 | B2 | 1/2011 | Chen | |
| 2012/0309158 | A1* | 12/2012 | Hung | H01L 29/7848 |
| | | | | 438/301 |
| 2014/0077313 | A1* | 3/2014 | Li | H01L 21/28185 |
| | | | | 257/410 |

* cited by examiner

*Primary Examiner* — Yu-Hsi D Sun
(74) *Attorney, Agent, or Firm* — Winston Hsu

(57) ABSTRACT

A method of fabricating a metal gate transistor includes providing a substrate. An interlayer dielectric layer covers the substrate. A dummy gate is embedded in the interlayer dielectric layer. A high-k dielectric layer is disposed between the dummy gate and the substrate. Later, the dummy gate is removed to form a trench, and the high-k dielectric layer is exposed through the trench. After the dummy gate is removed, an ion implantation process is performed to implant fluoride ions into the high-k dielectric layer. Finally, after the ion implantation process, a metal gate is formed to fill in the trench.

6 Claims, 6 Drawing Sheets

METHOD OF FABRICATING METAL GATE TRANSISTOR

BACKGROUND OF THE INVENTION

1. Field of the Invention

The present invention relates to a fabricating method of a metal gate transistor, and more particularly to a method of implanting fluorine ions into a high-k dielectric layer after removing a dummy gate.

2. Description of the Prior Art

In the field of semiconductor fabrication, the use of polysilicon material is diverse. Having a strong resistance to heat, polysilicon materials are commonly used to fabricate gate electrodes for metal-oxide semiconductor transistors. Devices fabricated by polysilicon still have many drawbacks.

For example, gate electrodes fabricated by polysilicon result in a depletion effect. A depletion region at the interface between the gate and the gate dielectric layer will occur during operation. This depletion region not only thickens the gate dielectric layer, but also lowers the capacitance of the gate, and ultimately reduces the driving ability of the device.

In order to solve this problem, metal gates are used to replace conventional polysilicon to fabricate gate electrodes. However, while forming a high-k dielectric serving as a gate dielectric, lattice defects or lattice vacancies are formed. These defects or vacancies deteriorate the efficiency of the transistor formed afterwards.

SUMMARY OF THE INVENTION

In light of the above, the present invention provides a method of fabricating a metal gate transistor to solve lattice defects and lattice vacancies.

According to a preferred embodiment of the present invention, a method of fabricating a metal gate transistor includes providing a substrate, an interlayer dielectric layer covering the substrate, a dummy gate embedded in the interlayer dielectric layer, a high-k dielectric layer disposed between the dummy gate and the substrate. Later, the dummy gate is removed to form a trench, wherein the high-k dielectric layer is exposed through the trench. After removing the dummy gate, an ion implantation process is performed to implant fluoride ions into the high-k dielectric layer. Finally, after the ion implantation process, a metal gate is formed to fill in the trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 depict a method of fabricating a metal gate transistor according to a preferred embodiment of the present invention, wherein:

FIG. 1 depicts a dummy gate on a substrate;
FIG. 2 is a fabricating stage following FIG. 1;
FIG. 3 is a fabricating stage following FIG. 2;
FIG. 4 is a fabricating stage following FIG. 3; and
FIG. 5 is a fabricating stage following FIG. 4.

DETAILED DESCRIPTION

FIG. 1 to FIG. 5 depict a method of fabricating a metal gate transistor according to a preferred embodiment of the present invention.

Figure 1:
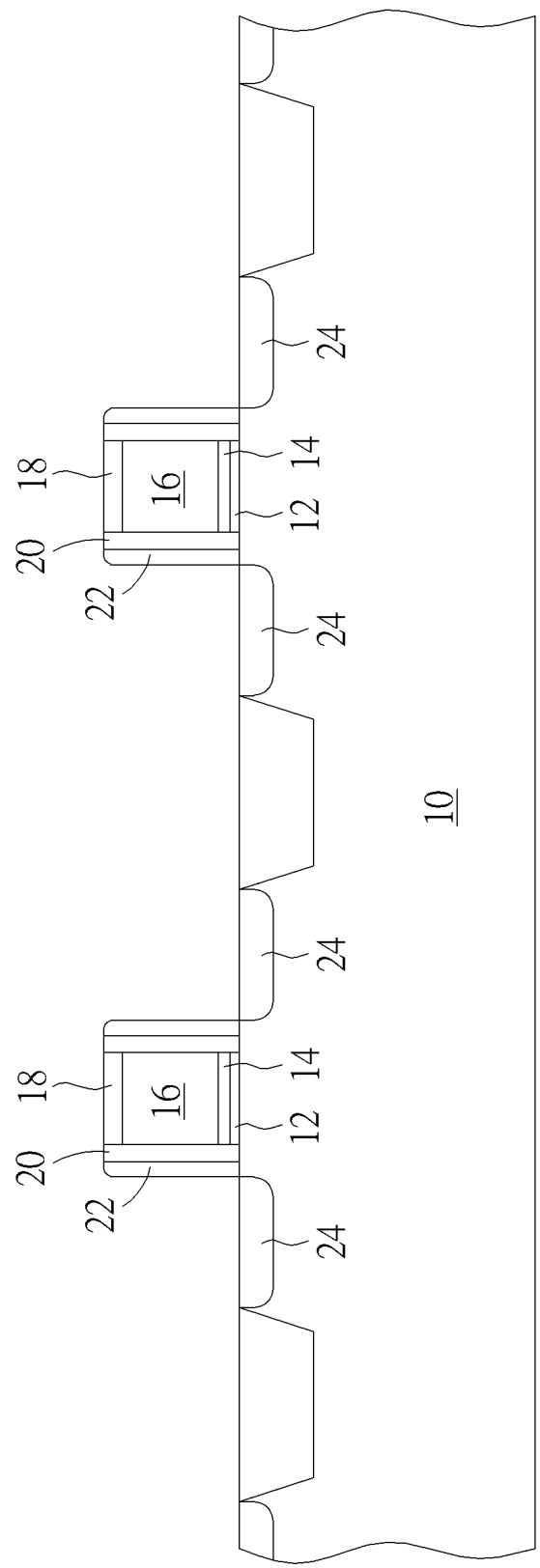
Figure 6:
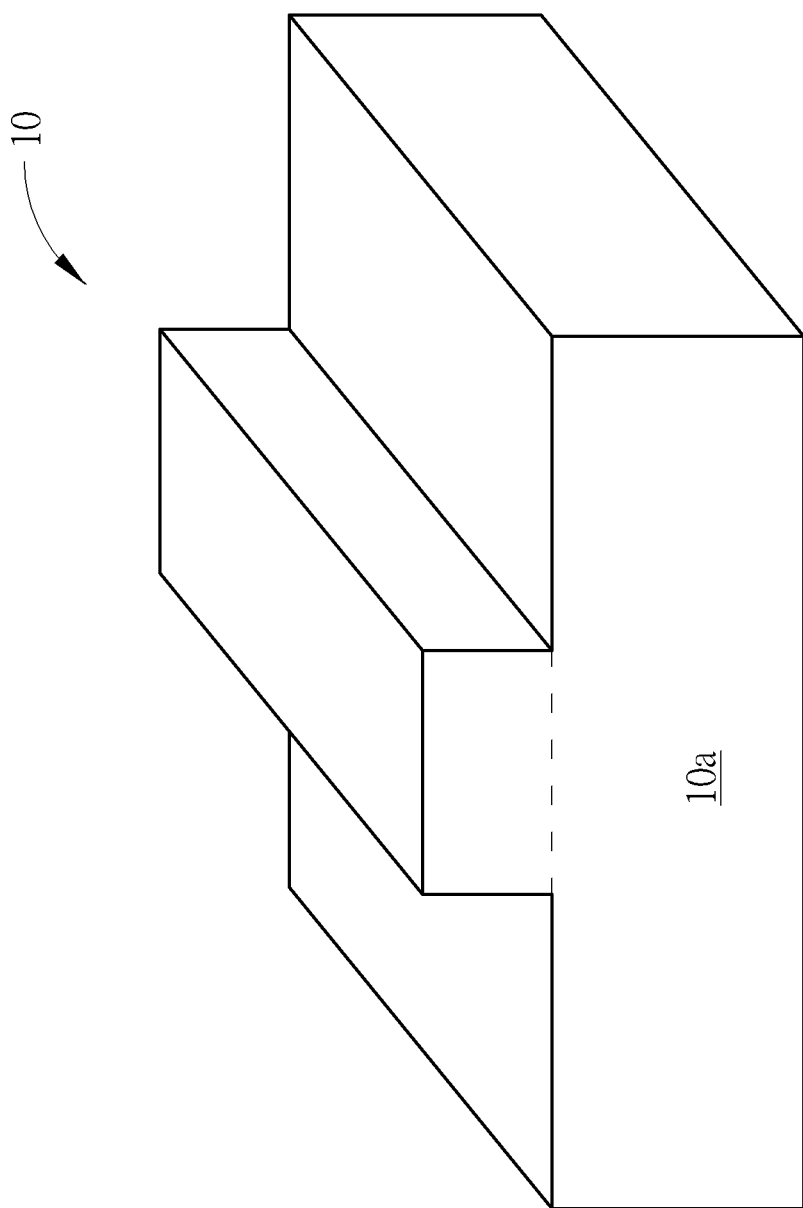
FIG. 6 depicts a fin structure protruding from a substrate according to a preferred embodiment of the present invention.

As shown in FIG. 1, a substrate 10 is provided. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. Moreover, as shown in FIG. 6, the substrate 10 may be a fin structure protruding from a substrate 10a.

Please refer to FIG. 1 again. A gate dielectric layer 12, a high-k dielectric layer 14, a dummy gate 16 and a cap layer 18 are formed on the substrate 10 in sequence. The gate dielectric layer 12 includes silicon oxide, silicon nitride, silicon carbide nitride, silicon oxynitride, silicon carbide oxynitride or other insulating materials. The high-k dielectric layer 14 includes $Al_2O_3$, $ZrO_2$, barium strontium titanate (BST), lead zirconate titanate (PZT), $ZrSiO_2$, $HfSiO_2$, $HfSiON$ or $TaO_2$. The dummy gate 16 includes polysilicon or other silicon-containing materials. The cap layer 18 includes silicon nitride or silicon oxide. The gate dielectric layer 12, the high-k dielectric layer 14, the dummy gate 16 and the cap layer 18 can be formed by a chemical vapor deposition process, a physical deposition process or an atomic layer deposition process.

Later, a liner 20 and a spacer 22 are formed to surround the gate dielectric layer 12, the high-k dielectric layer 14, the dummy gate 16 and the cap layer 18. The liner 20 can be silicon oxide. The liner 20 is preferably formed by a thermal process. The spacer 22 can include silicon oxide, silicon nitride, silicon carbide nitride, silicon oxynitride, silicon carbide oxynitride or other insulating materials. The spacer 22 can be formed by a deposition process followed by an etching process. After forming the spacer 22, two source/drain doping regions 24 are formed respectively in the substrate 10 at two sides of the dummy gate 16. The source/drain doping regions 24 may be formed by implanting N-type or P-type dopants into the substrate 10. In another preferred embodiment of the present invention, the source/drain doping regions 24 are formed by a selective epitaxial growth process including forming one or multiple semiconductor material layers such as silicon, germanium, silicon germanium or silicon carbide.

Figure 2:
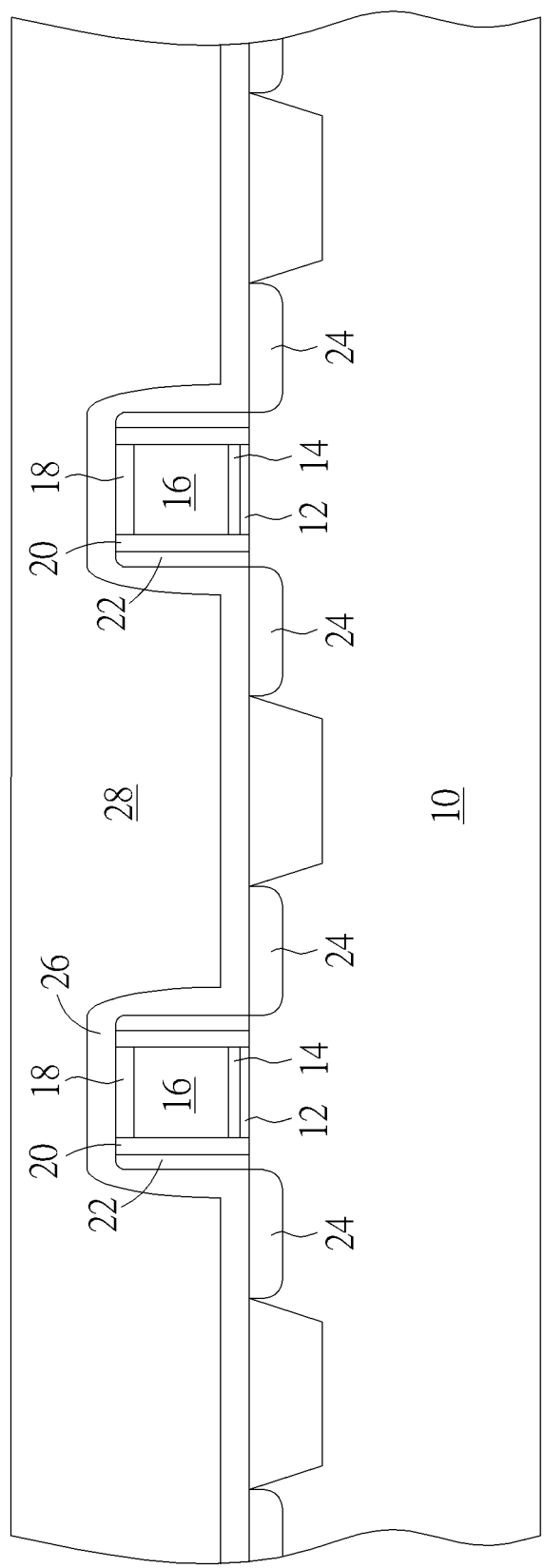
Figure 3:
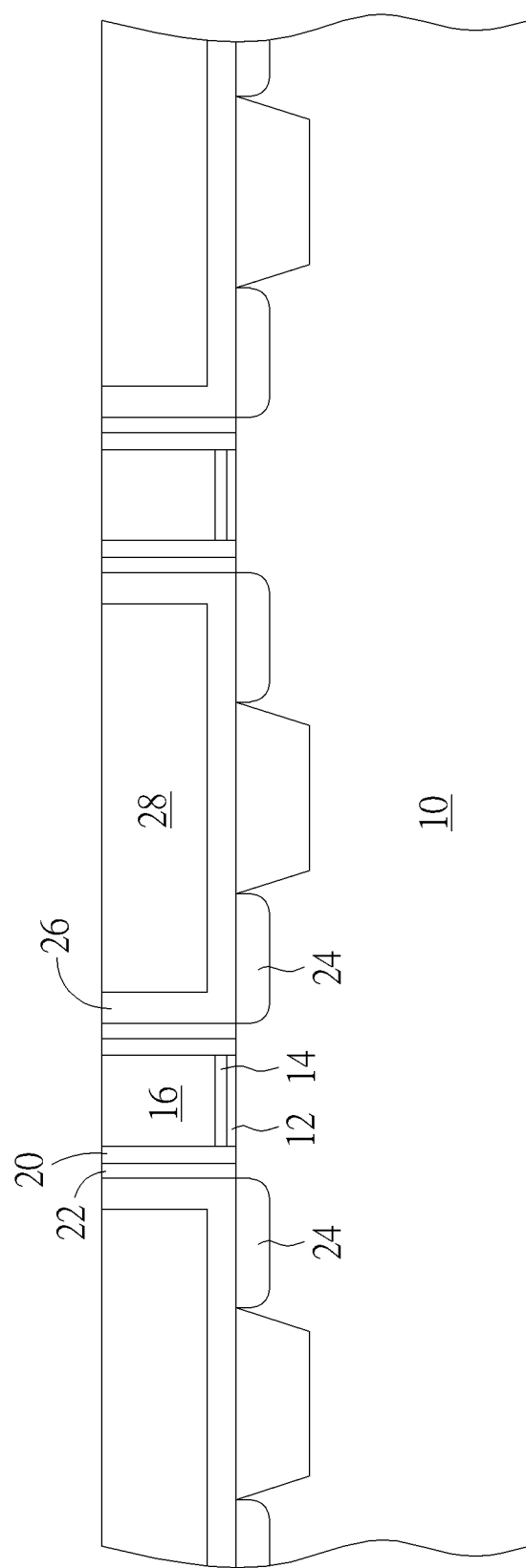
Figure 4:
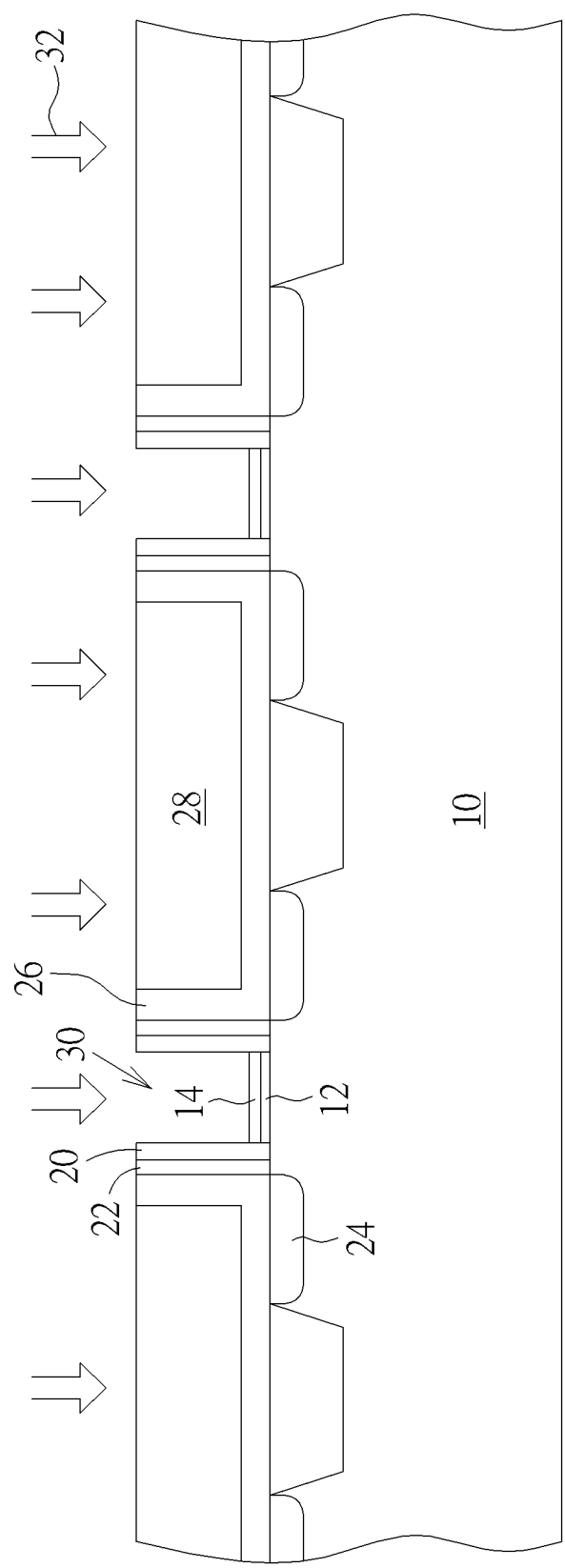

As shown in FIG. 2, an etching stop layer 26 is formed to cover the substrate 10, the spacer 22 and the cap layer 18. The etching stop layer 26 can includes silicon nitride or silicon carbide nitride. Next, an interlayer dielectric layer 28 is formed to cover the etching stop layer 26. The interlayer dielectric layer 28 includes phosphosilicate glass (PGS) or borophosphosilicate glass (BPSG). As shown in FIG. 3, the interlayer dielectric layer 28 and the etching stop layer 26 are planarized to expose the dummy gate 16. The interlayer dielectric layer 28 and the etching stop layer 26 can be planarized by a chemical mechanical planarization process. As shown in FIG. 4, the dummy gate 16 is removed and a trench 30 is formed. The high-k dielectric layer 14 is exposed through the trench 30. Subsequently, an ion implantation process 32 is performed to implant fluoride ions into the high-k dielectric layer 14 by taking the interlayer dielectric layer 28, the etching stop layer 26, the spacer 22 and the liner 20 as a mask. According to a preferred embodiment of the present invention, while performing the ion implantation process 32, the fluoride ions are implanted into the gate dielectric layer 12 as well. According to a preferred embodiment of the present invention, the implantation energy of the ion implantation process 32 is 6000 eV (electron volts). The dosage of fluorine ions is 5E15 atom/cm$^2$. The implantation energy and the dosage of fluorine ions can be altered based on the thickness of the gate dielectric layer 12 or the thickness of the high-k dielectric layer 14.

Figure 5:
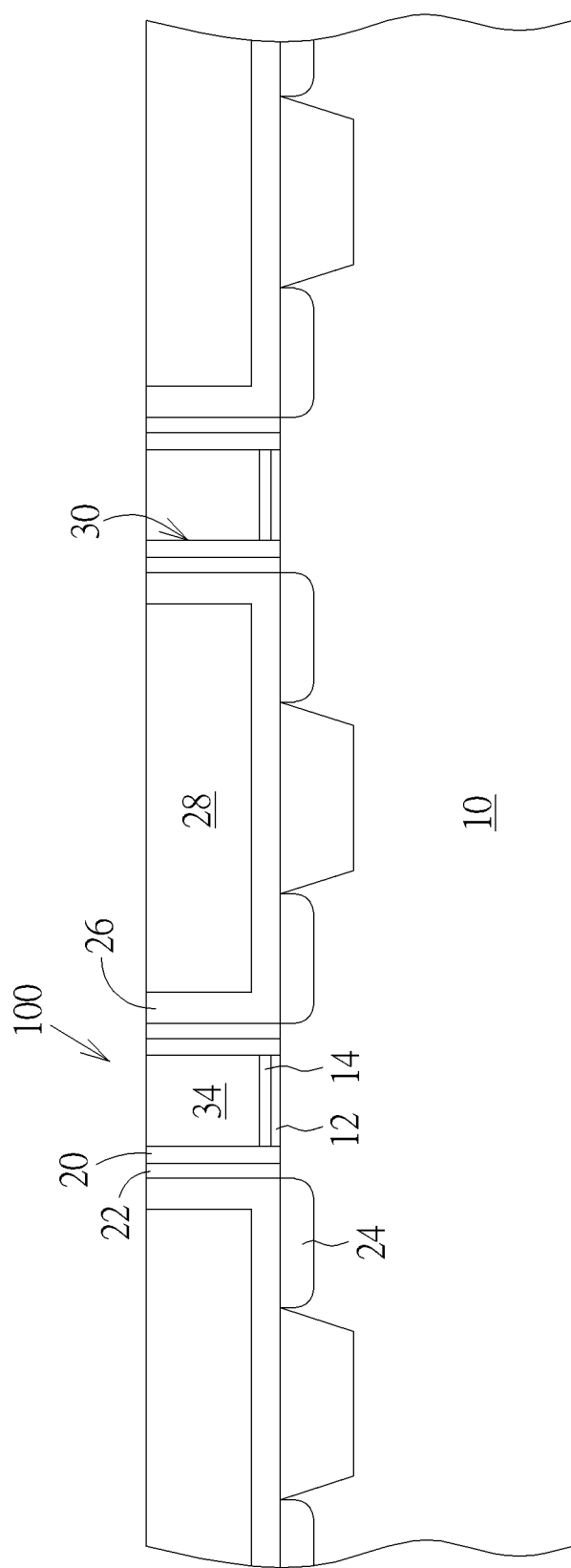

As shown in FIG. 5, a metal gate 34 is formed to fill in the trench 30 after the ion implantation process 32. Now, a metal gate transistor 100 of the present invention is completed. The metal gate 34 may be a single layer or a metal composite layer. For example, the metal gate 34 includes Al, Ti, Ta, W, Nb, Mo, Cu, TiN, TiC, TaN, Ti/W and Ti/TiN, but not limited to this. Moreover, different types of work function layers (not shown) can be disposed between the metal gate 34 and the high-k dielectric layer 14 based on the conductive type of the transistor. When the transistor is a P-type transistor, the work function layer is a P-type work function layer and exemplarily includes titanium nitride (TiN), tantalum nitride (TaN), titanium carbide (TiC), tantalum carbide (TaC), tungsten carbide (WC), or aluminum titanium nitride (TiAlN), but not limited to this. When the transistor is an N-type transistor, the work function layer is an N-type work function layer such as titanium aluminide (TiAl), zirconium aluminide (ZrAl), tungsten aluminide (WAl), tantalum aluminide (TaAl), or hafnium aluminide (HfAl), but not limited to this.

By implanting fluorine ions into the high-k dielectric layer and the gate dielectric layer, lattice defects or lattice vacancies in the high-k dielectric layer and the gate dielectric layer can be repaired. After lattice defects or lattice vacancies is repaired, the drain induced barrier lowering (DIBL), the flicker noise and the negative bias temperature instability of the metal gate transistor of the present invention are reduced. In this way, the efficiency of the metal gate transistor of the present invention is increased.

According to other embodiments, for a polysilicon gate transistor, fluorine ions can be implanted in a step different from the ion implantation process mentioned above. For example, the fluorine ions can be implanted into the high-k dielectric layer or the gate dielectric layer before the polysilicon gate is formed. On the other hand, the fluorine ions can be implanted after the polysilicon gate is formed. When the fluorine ions are implanted after forming the polysilicon gate, fluorine ions can penetrate the polysilicon gate and enter the high-k dielectric layer or the gate dielectric layer. However, after the fluorine ions are implanted, there are some fabricating steps need a thermal process such as a formation of source/drain doping regions. The fluorine ions will leave their position in the high-k dielectric layer or in the gate dielectric layer and even diffuse into the substrate because of the thermal process. The diffusion of the fluorine ions deteriorates the electric property of the polysilicon gate transistor.

The fabricating method of the present invention is especially suitable for a metal gate transistor. The fluorine ions in the fabricating method of the present invention are implanted into the high-k dielectric layer and the gate dielectric layer after the dummy gate is removed. Because some thermal processes including driving in source/drain doping regions are completed before removing the dummy gate, the implanted fluorine ions will not undergo any other thermal processes. In this way, the implanted fluorine ions can be kept in the high-k dielectric layer and the gate dielectric layer. Moreover, because the fluorine ions are implanted after removing the dummy gate, the fluorine ions do not need to penetrate the dummy gate to enter the high-k dielectric layer or the gate dielectric layer. In this way, the implantation energy can be smaller; therefore positions of the fluorine ions can be controlled more accurately and fluorine ions can be prevented from been implanted too deeply.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a metal gate transistor, comprising:
   providing a substrate, an interlayer dielectric layer covering the substrate, a dummy gate embedded in the interlayer dielectric layer, a high-k dielectric layer disposed between the dummy gate and the substrate;
   removing the dummy gate to form a trench, wherein the high-k dielectric layer is exposed through the trench;
   after removing the dummy gate, performing an ion implantation process to implant fluoride ions into the high-k dielectric layer; and
   after the ion implantation process, forming a metal gate to fill in the trench.

2. The method of fabricating a metal gate transistor of claim 1, wherein a gate dielectric layer is disposed between the high-k dielectric layer and the substrate.

3. The method of fabricating a metal gate transistor of claim 2, wherein while performing the ion implantation process, the fluoride ions are implanted into the gate dielectric layer.

4. The method of fabricating a metal gate transistor of claim 2, wherein the gate dielectric layer comprises silicon oxide, silicon nitride, silicon carbide nitride, silicon oxynitride or silicon carbide oxynitride.

5. The method of fabricating a metal gate transistor of claim 1, wherein the high-k dielectric layer comprises $Al_2O_3$, $ZrO_2$, barium strontium titanate (BST), lead zirconate titanate (PZT), $ZrSiO_2$, $HfSiO_2$, HfSiON or $TaO_2$.

6. The method of fabricating a metal gate transistor of claim 1, wherein two source/drain doping regions are disposed in the substrate at two sides of the dummy gate.

* * * * *